(12) United States Patent
Shin et al.

(10) Patent No.: US 7,470,634 B2
(45) Date of Patent: Dec. 30, 2008

(54) METHOD FOR FORMING INTERLAYER DIELECTRIC FILM FOR SEMICONDUCTOR DEVICE BY USING POLYHEDRAL MOLECULAR SILSESQUIOXANE

(75) Inventors: Hyeon Jin Shin, Gyeonggi-Do (KR); Hyun Dam Jeong, Gyeonggi-Do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 383 days.

(21) Appl. No.: 10/995,211

(22) Filed: Nov. 24, 2004

(65) Prior Publication Data

US 2005/0136268 A1 Jun. 23, 2005

(30) Foreign Application Priority Data

Nov. 24, 2003 (KR) ...................... 10-2003-0083580
Nov. 22, 2004 (KR) ...................... 10-2004-0095797

(51) Int. Cl.
*H01L 21/4763* (2006.01)
*B32B 9/04* (2006.01)

(52) U.S. Cl. ...................... 438/781; 438/780; 428/447; 257/632; 528/10

(58) Field of Classification Search ................. 438/780, 438/781; 257/632; 528/10; 428/447
See application file for complete search history.

(56) References Cited

U.S. PATENT DOCUMENTS

| 3,615,272 | A | 10/1971 | Collins et al. |
| 4,399,266 | A | 8/1983 | Matsumura et al. |
| 4,756,977 | A | 7/1988 | Haluska et al. |
| 4,999,397 | A | 3/1991 | Weiss et al. |
| 5,010,159 | A | 4/1991 | Bank et al. |
| 5,853,808 | A | 12/1998 | Arkles et al. |
| 6,000,339 | A | 12/1999 | Matsuzawa |
| 6,232,424 | B1 | 5/2001 | Zhong et al. |
| 2003/0055193 | A1* | 3/2003 | Lichtenhan et al. ........... 528/10 |
| 2003/0078443 | A1* | 4/2003 | Lee et al. .................... 549/497 |

FOREIGN PATENT DOCUMENTS

EP 0 997 497 A1 5/2000

* cited by examiner

*Primary Examiner*—Alexander G Ghyka
(74) *Attorney, Agent, or Firm*—Buchanan Ingersoll & Rooney PC

(57) ABSTRACT

Disclosed herein is a method for forming an interlayer dielectric film for a semiconductor device by using a polyhedral molecular silsesquioxane. According to the method, the polyhedral molecular silsesquioxane is used as a monomer for a siloxane-based resin or as a pore-forming agent (porogen) to prepare a composition for forming a dielectric film, and the composition is coated on a substrate to form an interlayer dielectric film for a semiconductor device. The interlayer dielectric film formed by the method has a low dielectric constant and shows superior mechanical properties.

25 Claims, 1 Drawing Sheet

METHOD FOR FORMING INTERLAYER DIELECTRIC FILM FOR SEMICONDUCTOR DEVICE BY USING POLYHEDRAL MOLECULAR SILSESQUIOXANE

BACKGROUND OF THE INVENTION

This non-provisional application claims priority under 35 U.S.C. § 119(a) on Korean Patent Application No. 2003-83580 filed on Nov. 24, 2003, and Korean Patent Application No. 2004-95797 filed on Nov. 22, 2004 which are herein incorporated by reference.

1. Field of the Invention

The present invention relates to a method for forming an interlayer dielectric film for a semiconductor device by using a polyhedral molecular silsesquioxane. More specifically, the present invention relates to a method for forming a dielectric film by using a polyhedral molecular silsesquioxane as a monomer for a siloxane-based resin or as a pore-forming agent (hereinafter, referred to as a "porogen") to prepare a composition for forming a dielectric film, and coating the composition on a substrate. Since the polyhedral molecular silsesquioxane used in the method contains a number of internal pores, a dielectric film formed by the method has a low dielectric constant. In addition, since a variety of reactive groups can be introduced into the polyhedral molecular silsesquioxane, the control over the reactive groups leads to a dielectric film having superior mechanical properties.

2. Description of the Related Art

With the increasing integration of semiconductor devices, the speed between wirings has a significant impact on the performance of the semiconductor devices. Accordingly, an interlayer dielectric film having a low storage capacity is required in order to lower the resistance and capacity between wirings. For this purpose, attempts have been made to use low dielectric constant materials for interlayer dielectric films. For instance, U.S. Pat. Nos. 3,615,272, 4,399,266, 4,756,977 and 4,999,397 disclose polysilsesquioxanes having a dielectric constant of about 2.5~3.1 which can be applied by spin-on deposition ("SOD"), which can replace $SiO_2$ having a dielectric constant of around 4.00 applied by a conventional chemical vapor deposition (CVD) technique. The compounds can be spin-coated due to their good planarizability.

On the other hand, hydrogen silsesquioxanes and a number of preparation processes thereof are well known in the art. For example, U.S. Pat. No. 3,615,272 teaches the production of a nearly fully condensed hydrogen resin by a process comprising hydrolyzing trichlorosilane in a benzenesulfonic acid hydrate hydrolysis medium and then washing the resultant resin with water or aqueous sulfuric acid. Further, U.S. Pat. No. 5,010,159 discloses a process for preparing a hydrogen silsesquioxane by hydrolyzing a hydridosilane in an arylsulfonic acid hydrate hydrolysis medium to form a resin, and contacting the resin with a neutralizing agent. Further, U.S. Pat. No. 6,232,424 suggests a highly soluble silicone resin composition having excellent solution stability which is prepared by hydrolyzing and condensing a tetraalkoxysilane, an organosilane and an organotrialkoxysilane in the presence of water and a catalyst. Further, U.S. Pat. No. 6,000,339 reports a process for preparing a silica-based compound which has improved oxygen plasma resistance and other physical properties, and enables thick-layer formation. According to this process, the silica-based compound is prepared by reacting a monomer selected from alkoxysilanes, fluorine-containing alkoxysilanes and alkylalkoxysilanes, with an alkoxide of titanium (Ti) or zirconium (Zr) in the presence of water and a catalyst. Further, U.S. Pat. No. 5,853,808 discloses siloxane and silsesquioxane polymers useful for preparing $SiO_2$-rich thin films wherein the polymers are prepared from organosilanes having a β-substituted reactive group, and thin film compositions comprising the polymers. Further, EP 0 997 497 A1 describes a composition comprising an alkoxysilane compound selected from monoalkoxysilanes, dialkoxysilanes, trialkoxysilanes, tetraalkoxysilanes and trialkoxysilane dimmers, and an organic polymer. This patent further describes an insulating thin film formed by using the composition.

In an attempt to lower the dielectric constant of an interlayer dielectric film for a semiconductor device to 2.5 or lower, a porogen-template approach is suggested wherein the siloxane-based resin is formulated with a porogen and then the porogen is removed by thermal decomposition. However, problems encountered with this approach are that Si—OH bonds are formed on the pore surface, and the pore walls collapse and connect with one another during removal of the porogen, as depicted in FIG. 1. These problems degrade the process applicability of porous dielectric films to dielectric films for semiconductor devices.

For example, a great deal of research has been conducted on a cage-structured siloxane-based monomer having a diagonal length of about 5.3 Å, represented by the following Formula 1:

Formula 1

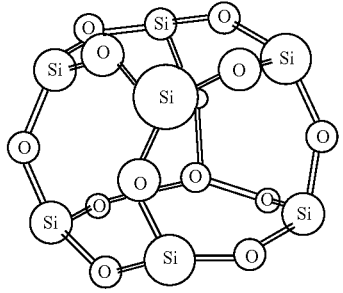

However, since a dielectric film formed using the siloxane-based monomer has a relatively high dielectric constant of 2.7~3.0, the addition of a porogen is required in order to lower the dielectric constant. As a result, the above-mentioned problems inevitably occur.

SUMMARY OF THE INVENTION

Therefore, the present invention has been made in view of the above problems of the prior art, and a feature of the present invention is to provide a method for forming an interlayer dielectric film for a semiconductor device by using a porous polyhedral molecular silsesquioxane as a monomer for a siloxane-based resin, which is used for the formation of a dielectric film, or as a porogen, which is one component of a composition for forming a dielectric film. A dielectric film formed by the method has a low dielectric constant, and shows superior mechanical properties, thermal stability, crack resistance, and the like, by a variety of reactive groups introduced into the polyhedral molecular silsesquioxane.

In accordance with one aspect of the present invention, there is provided a siloxane-based resin prepared by hydrolyzing and polycondensing at least one polyhedral molecular silsesquioxane represented by Formula 2 below:

$[SiO_{1.5}]_n$—$(R)_n$   Formula 2 wherein the substituents R may be the same or different from one another, and are each independently a hydrogen atom, a halogen atom, a hydroxyl group, or a $C_{1\sim20}$ alkyl, alkenyl, alkynyl, aryl or alkoxy group, or —OSir$_1$r$_2$r$_3$ (in which r$_1$, r$_2$ and r$_3$ are each independently a hydrogen atom, a halogen atom, or a $C_{1\sim20}$ alkyl, alkenyl, alkynyl, aryl or alkoxy group), at least one of the substituents R being a hydrolysable functional group; and n is 10, 12, 14, or 16, alone or a mixture of the polyhedral molecular silsesquioxane and at least one silane-based monomer in an organic solvent in the presence of water and an acid or base catalyst.

In accordance with another aspect of the present invention, there is provided a composition for forming a dielectric film, comprising the siloxane-based resin, and an organic solvent.

In accordance with another aspect of the present invention, there is provided a composition for forming a dielectric film, comprising the polyhedral molecular silsesquioxane of Formula 2, a thermostable siloxane precursor, and a solvent dissolving the two components.

In accordance with another aspect of the present invention, there is provided a method for forming a dielectric-film, comprising the steps of coating the composition on a substrate, and heat-curing the coated substrate.

In accordance with still another aspect of the present invention, there is provided an interlayer dielectric film for a semiconductor device formed by the method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
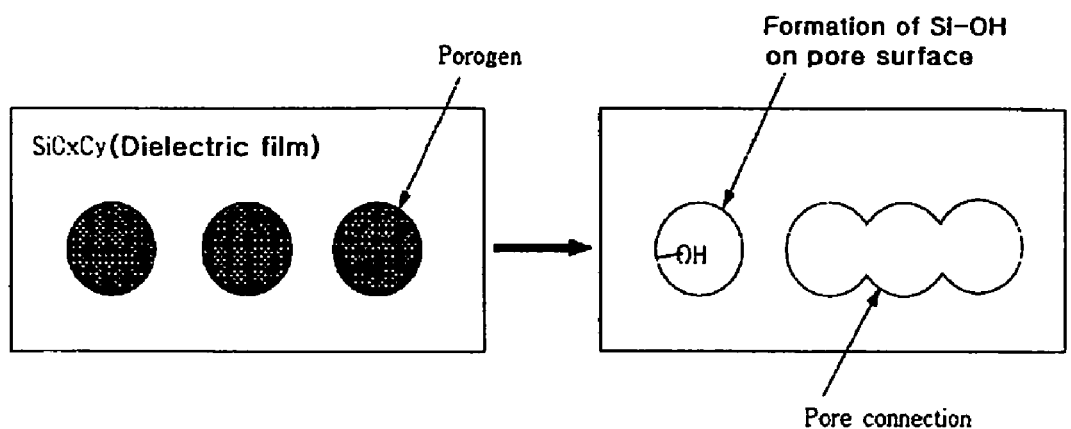
FIG. 1 is a diagram illustrating problems arising in the formation of a porous thin film according to prior art.

Hereinafter, the present invention will be explained in more detail.

A polyhedral molecular silsesquioxane used in the present invention is represented by Formula 2:

$$[SiO_{1.5}]_n\text{—}(R) \quad (2)$$

wherein the substituents R may be the same or different from one another, and are each independently a hydrogen atom, a halogen atom, a hydroxyl group, or a $C_{1\sim20}$ alkyl, alkenyl, alkynyl, aryl or alkoxy group, or —OSir$_1$r$_2$r$_3$ (in which r$_1$, r$_2$ and r$_3$ are each independently a hydrogen atom, a halogen atom, or a $C_{1\sim20}$ alkyl, alkenyl, alkynyl, aryl or alkoxy group), at least one of the substituents R being a hydrolysable functional group; and n is 10, 12, 14, or 16.

At least one polyhedral molecular silsesquioxane of Formula 2 can be directly used for the preparation of a siloxane-based resin, which is used for the formation of a dielectric film. Alternatively, the polyhedral molecular silsesquioxane can be used as a porogen, which is one component of a composition for forming a dielectric film.

More detailed explanation regarding the procedure for the preparation of a siloxane-based resin by using the molecular monomer silsesquioxane will be specifically described below.

A siloxane-based resin of the present invention is prepared by polycondensing the polyhedral molecular silsesquioxane alone or a mixture of the polyhedral molecular silsesquioxane and at least one silane-based monomer selected from the group consisting of compounds represented by Formulae 3 to 6 below:

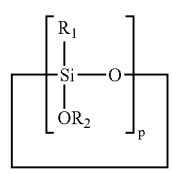

Formula 3 wherein $R_1$ is a hydrogen atom, a $C_{1\sim3}$ alkyl group, or a $C_{6\sim15}$ aryl group; $R_2$ is a hydrogen atom, a $C_{1\sim10}$ alkyl group, or $SiX_1X_2X_3$ (in which $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group); and p is an integer between 3 and 8;

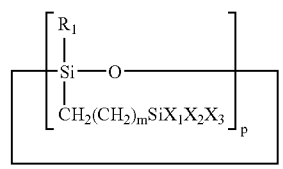

Formula 4 wherein $R_1$ is a hydrogen atom, a $C_{1\sim3}$ alkyl group, or a $C_{6\sim15}$ aryl group; $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; m is an integer of 0 to 10; and p is an integer of 3 to 8;

$$X_3X_2X_1Si\text{-}M\text{-}SiX_1X_2X_3 \quad \text{Formula 5}$$

wherein $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; and M is a single bond, a $C_{1\sim10}$ alkylene group, or a $C_{6\sim15}$ arylene group; and $$(R_1)_nSi(OR_2)_{4-n} \quad \text{Formula 6}$$

wherein $R_1$ is a hydrogen atom, a $C_{1\sim3}$ alkyl group, a halogen atom, or a $C_{6\sim15}$ aryl group; $R_2$ is a hydrogen atom, a $C_{1\sim3}$ alkyl group, or a $C_{6\sim15}$ aryl group, at least one of the substituents $R_1$ and $OR_2$ being a hydrolysable functional group; and n is an integer of 0 to 3, in an organic solvent in the presence of water and an acid or base catalyst.

The most basic structure of the polyhedral molecular silsesquioxane (wherein R is H) is represented by the following Formula 7:

Formula 7

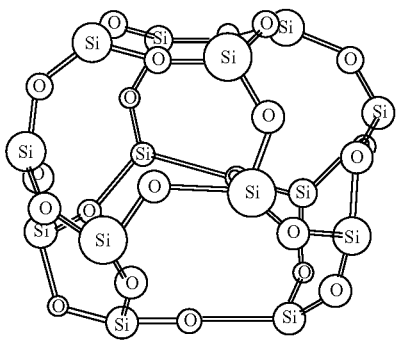

In the above Formula 7, a variety of substituents may be bonded to the Si atoms. The modification of the Si—H bonds into Si—OH, Si—OR, Si—CH=CH$_2$ bonds, etc. makes a sol-gel reaction and a polymerization reaction of the polyhedral molecular silsesquioxane possible. Since the respective functional groups have a high compatibility with the siloxane-based resin, the polyhedral molecular silsesquioxane can be used as an additive to utilize the internal pores.

Silsesquioxane where hydrogen atoms are bonded to the Si atoms has a Si—O—Si skeleton whose body diagonal length is about 8.3 Å. Based on this feature, a dielectric film containing the silsesquioxane may have a dielectric constant as low as 1.8~2.5. Further, a polyhedral oligomeric silsesquioxane wherein hydrogen atoms are bonded to the oxygen atoms directing toward the outside of the molecule can be used as a starting monomer to prepare a polymer. In the case that the polymer is used to form a dielectric film, all the Si atoms present in the molecule have a shape of a "Q". Accordingly, the dielectric film thus formed has superior physical properties, including modulus and hardness, and has a low coefficient of thermal expansion (CTE).

Figure 2:
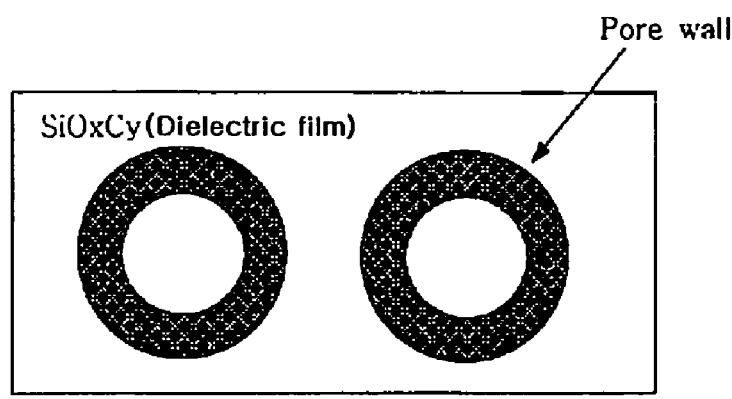
FIG. 2 is a diagram showing the structure of a dielectric film formed by a method of the present invention.

Further, the use of the above polyhedral molecular silsesquioxanes enables the formation of a dielectric film having pore walls, as shown in FIG. 2. That is, spherical dielectric entities within which pores are formed are introduced into a thin film to form a porous dielectric film. In this case, since the dielectric entities have a complete shape at the molecular level, they do not give rise to the formation of Si—OH bonds and the connection of pores in the thin film resulting from the aggregation of porogens, unlike in the conventional thin film. When the dielectric film is applied to semiconductor fabrication processes, molecules, such as HF and H$_2$O, liable to be formed in the dielectric film, cannot enter the pores, leading to improved process applicability, and the total volume of the pores increases. Accordingly, there is no problem in lowering the dielectric constant to 2.0 or less. In addition, since the porogens are not removed by heating, unlike in the prior art, it is assumed that decrease in physical properties relative to the same dielectric constant is low, despite the low dielectric constant resulting from the pore formation.

Polyhedral molecular silsesquioxanes containing various substituents used in the present invention are prepared as depicted in Reaction Scheme 1 below:

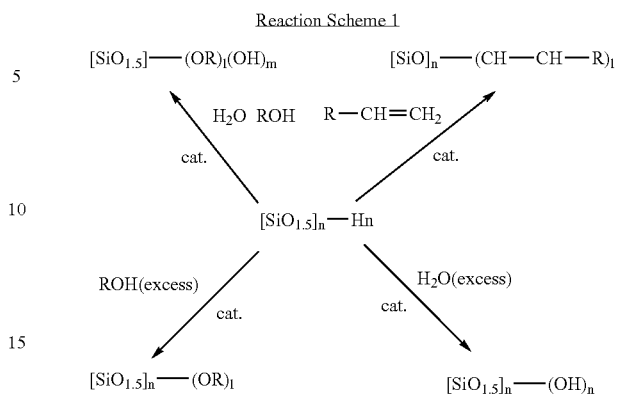

Preferably, a siloxane-based resin can be prepared by polycondensing, as a polyhedral molecular silsesquioxane, a compound represented by Formula 8 below:

$$[SiO_{1.5}]_n(H)_n \qquad \text{Formula 8}$$

wherein n is 10, 12, 14, or 16, alone or a mixture of the polyhedral molecular silsesquioxane and at least one silane-based monomer selected from the group consisting of the compounds of Formulae 3 to 6 in an organic solvent in the presence of water and an acid or base catalyst.

In the preparation of the siloxane-based resin, the molar ratio of the polyhedral molecular silsesquioxane to at least one silane-based monomer selected from the group consisting of the compounds of Formulae 3 to 6 preferably ranges from 9.999:0.001 to 0.001:9.999.

The acid or base catalyst used to prepare the siloxane-based resin is selected from the group consisting of hydrochloric acid, nitric acid, benzene sulfonic acid, oxalic acid, formic acid, potassium hydroxide, sodium hydroxide, triethylamine, sodium bicarbonate, pyridine, Pt, Pd derivatives, and the like. The molar ratio of the catalyst to the monomers is preferably in the range of from 1:0.00001 to 1:10.

On the other hand, the molar ratio of the water used during the hydrolysis and polycondensation to the monomers is preferably in the range of 1:1 to 1:100.

As preferred organic solvents, there may be mentioned, for example: aliphatic hydrocarbon solvents, such as hexane; aromatic hydrocarbon solvents, such as anisole, mesitylene and xylene; ketone-based solvents, such as methyl isobutyl ketone, 1-methyl-2-pyrrolidinone, cyclohexanone and acetone; ether-based solvents, such as tetrahydrofuran and isopropyl ether; acetate-based solvents, such as ethyl acetate, butyl acetate and propylene glycol methyl ether acetate; alcohol-based solvents, such as isopropyl alcohol and butyl alcohol; amide-based solvents, such as dimethylacetamide and dimethylformamide; silicon-based solvents; and mixtures thereof.

The hydrolysis and the polycondensation are preferably carried out at 0° C.~200° C. for 0.1~100 hours.

The siloxane-based resin thus prepared preferably has a weight-average molecular weight ranging from 1,000 to 300,000.

The present invention also provides a composition for forming a dielectric film, which is prepared by dissolving the siloxane-based resin in the above-mentioned solvent. If desired, the composition of the present invention may further comprise a previously known porogen.

The present invention also provides a porous composition for forming a dielectric film, comprising the polyhedral molecular silsesquioxane of Formula 2 acting as a porogen, a thermostable siloxane precursor, and a solvent dissolving the two components. The polyhedral molecular silsesquioxane itself can act as a porogen, and optionally it can be combined with other known porogens.

Preferred examples of porogens to be combined with the polyhedral molecular silsesquioxane include cyclodextrins, polycaprolactones, Brij surfactants, polyethylene glycol-polypropylene glycol-polyethylene glycol triblock copolymer surfactants, and derivatives thereof.

The porogen is used in an amount of 0.1~99.9% by weight, preferably 1~70% by weight, based on the total weight of the solid matter (namely, the matrix precursor and the porogen) in the composition, but the present invention is not limited to these ranges.

In the composition of the present invention wherein the polyhedral molecular silsesquioxane is used as a porogen, the thermostable siloxane precursor can be prepared using the siloxane-based monomer selected from the group consisting of the compounds of Formulae 3 to 6 in the same manner as in the preparation of the siloxane-based resin.

Organic solvents usable to prepare the composition for forming a dielectric film include, but are not particularly limited to, all organic solvents described above.

The solid content in the composition is preferably in the range of 5~70% by weight, based on the total weight of the composition, but is not particularly limited to this range.

The present invention also provides a method for forming a dielectric film by coating the composition comprising the siloxane-based resin prepared using the polyhedral molecular silsesquioxane or the composition comprising the polyhedral molecular silsesquioxane as a porogen on a substrate, and curing the coated substrate.

It is to be understood that various substrates can be used without limitation so far as they do not detract from the object of the present invention. Examples of substrates usable in the present invention include any substrates that are capable of withstanding the heat-curing conditions employed. Glass, silicon wafer and plastic substrates can be used according to the intended application. In the present invention, the application of the coating solution may be carried out by, but is not especially limited to, spin coating, dip coating, spray coating, flow coating and screen printing techniques. In view of ease of application and thickness uniformity, the most preferred coating technique is spin coating. Upon spin coating, the spinning speed is preferably adjusted within 800~5,000 rpm.

Optionally, the organic solvent used is evaporated to dry the film after coating. The film drying can be conducted by exposing the film to atmosphere, subjecting the film to a vacuum in the initial stage of the subsequent heat-curing step, or heating the film to a temperature of 200° C. or lower.

Thereafter, the film is heat-cured at a temperature of 150~600° C. and preferably 200~450° C. for 1~180 minutes to form a crack-free insoluble coating film. The term "crack-free coating film" as used herein is defined as a film including no cracks when observed under an optical microscope at a magnification of 1,000×. As used herein, the term "insoluble coating film" refers to a film substantially insoluble in solvents used to deposit the siloxane-based polymer or solvents known to be useful in applying a resin to a substrate. In the case of the composition comprising another porogen in addition to the polyhedral molecular silsesquioxane, the heat-curing temperature is determined considering the decomposition temperature of the porogen.

Since the dielectric film formed using the polyhedral molecular silsesquioxane has a dielectric constant of 3.0 or less, depending on the content of the polyhedral silsesquioxane, it can be suitable for use as a low dielectric constant interlayer dielectric film for a semiconductor device. Since the dielectric film formed by the method of the present invention shows superior mechanical properties, such as toughness and elasticity, and has a low carbon content, it can be useful as an interlayer dielectric film for a semiconductor device.

Hereinafter, the present invention will be described in more detail with reference to the following examples. However, these examples are given for the purpose of illustration and are not to be construed as limiting the scope of the invention.

First, the procedures for measuring the performance of dielectric films formed in the following examples are explained in detail.

1. Measurement of Dielectric Constant:

A silicon thermal oxide film is applied to a boron-doped p-type silicon wafer to a thickness of 3,000 Å, and then a 100 Å thick titanium film, a 2,000 Å thick aluminum film and a 100 Å thick titanium film are sequentially formed on the silicon oxide film using a metal evaporator. Thereafter, a dielectric film is coated on the resulting structure, after which a 100 Å thick spherical titanium thin film (diameter: 1 mm) and a 5,000 Å thin aluminum thin film (diameter: 1 mm) are sequentially formed on the dielectric film using a hardmask designed so as to have an electrode diameter of 1 mm, to form a metal-insulator-metal (MIM)-structured low dielectric constant thin film for dielectric constant measurement. The capacitance of the thin film is measured around 10 kHz, 100 kHz and 1 MHz using a PRECISION LCR METER (HP4284A) accompanied with a probe station (Micromanipulator 6200 probe station). The thickness of the thin film is measured using a prism coupler. The dielectric constant ($\kappa$) of the thin film is calculated according to the following equation:

$$\kappa = C \times d / \epsilon_o \times A$$

in which $\kappa$ is the relative permittivity, C is the capacitance of the dielectric film, $\epsilon_o$ is the dielectric constant of a vacuum (8.8542×10$^{-12}$ Fm$^{-1}$), d is the thickness of the dielectric film, and A is the contact cross-sectional area of the electrode.

2. Hardness and Modulus:

The hardness and modulus of a dielectric film are determined by quantitative analysis using a Nanoindenter II (MTS). Specifically, when the thin film is indented into the Nanoindenter until the indentation depth reaches 10% of the overall thickness of the thin film, the hardness and modulus of the thin film are measured. At this time, the thickness of the thin film is measured using a prism coupler. In order to ensure better reliability of these measurements in the following Examples and Comparative Examples, the hardness and modulus are measured at a total of 9 indentation points on the dielectric film, and the obtained values are averaged.

Preparation of Polyhedral Molecular Silsesquioxanes

PREPARATIVE EXAMPLE 1

80 g of sulfuric acid (H$_2$SO$_4$) and fuming H$_2$SO$_4$ containing 15% SO$_3$ were mixed with 200 ml of benzene in a dry flask, and the resulting mixture was vigorously stirred. To the mixture was slowly added 12.7 g (0.094 mol) of trichlorosilane over 6 hours. After completion of the addition, the obtained organic layer was washed several times with 50% H$_2$SO$_4$, followed by distilled water. The organic layer was filtered to remove undissolved and unremoved materials, and concentrated to afford 4.8 g of a mixture of the polyhedral molecular silsesquioxane precursors of Formula 8 (n=12, 14 and 16, respectively). The polyhedral molecular silsesquioxane precursors were separated from one another by sublimation.

PREPARATIVE EXAMPLE 2

1 g of $[Si_{14}O_{21}]H_{14}$ (n=14) prepared in Preparative Example 1 was dissolved in 20 ml of methanol in a flask, and then 0.1 g of Pd/C was added thereto. The resulting mixture was allowed to react at room temperature for 8 hours, affording 0.8 g of $[Si_{14}O_{21}]OMe_{14}$.

Preparation of Polymers containing Polyhedral Molecular Silsesquioxanes

PREPARATIVE EXAMPLE 3

5 g of the monomer $[Si_{14}O_{21}]H_{14}$ prepared in Preparative Example 1 was placed in a flask, and was then diluted with benzene until the concentration of the solution was 0.05~0.07M. After 0.01 mmol % of $PtCl_2$ was put in the flask, the solution was reacted for 12 hours at room temperature. After the reaction was completed, the solution was filtered through celite to remove the catalyst, and the filtrate was passed through a filter (pore size: 0.2 μm) to obtain a white powder. The powder was dried under 0.9 torr at 0~20° C. for 4 hours to afford 3.5 g of a siloxane-based polymer ["(a-1)"].

The contents (%) of Si—OH, Si—OCH$_3$ and Si—CH$_3$ in the polymer were measured by the following equations:

Si—OH (%)=Area (Si—OH)÷[Area (Si—OH)+Area (Si—OCH$_3$)/3+Area (Si—CH$_3$)/3]×100

Si—OCH$_3$ (%)=Area (Si—OCH$_3$)/3÷[Area (Si—OH)+Area (Si—OCH$_3$)/3+Area (Si—CH$_3$)/3]×100

Si—CH$_3$ (%)=Area (Si—CH$_3$)/3÷[Area (Si—OH)+Area (Si—OCH$_3$)/3+Area (Si—CH$_3$)/3]×100

As a result, the contents of Si—OH and Si—CH$_3$ were 38.70% and 61.30%, respectively.

PREPARATIVE EXAMPLE 4

The procedure of Preparative Example 3 was repeated, except that tetrahydrofuran was used as the solvent instead of benzene. The resulting solution was reacted for 6 hours at room temperature. After the reaction was completed, 5 g of 2,4,6,8-tetramethyl-2,4,6,8-tetrakis(trimethoxysilyl)cyclosiloxane was added to the flask. The reaction solution was cooled to −78° C. After 0.484 mmol of hydrochloric acid and 241.2 mmol of water were added to the flask, the reaction temperature was gradually raised to 70° C. At this temperature, the reaction was continued for 6 hours. The reaction solution was transferred to a separatory funnel, followed by addition of diethyl ether and tetrahydrofuran in the same amount as the first amount of tetrahydrofuran. The resulting mixture was washed three times with water in the amount of one eighth of the total volume of the solvents used, and was then distilled at reduced pressure to remove volatile materials, giving a polymer as a white powder. The polymer was dissolved in tetrahydrofuran until it became transparent, and passed through a filter (pore size: 0.2 μm). Water was added to the filtrate to obtain a precipitate as a white powder. The precipitate was dried under 0.9 torr at 0~20° C. for 8 hours to afford 6.2 g of a siloxane-based polymer [("a-2")]. The contents of Si—OH, Si—OCH$_3$ and Si—CH$_3$ in the polymer were measured to be 39.50%, 0.65% and 59.85%, respectively.

PREPARATIVE EXAMPLE 5

A polymer ["(a-3)"] was prepared in the same manner as in Preparative Example 4, except that 2,4,6,8-tetramethyl-2,4,6,8-tetrakis(trimethoxysilyl)cyclosiloxane (T4Q4) and methyltrimethoxysilane (MTMS, Aldrich) as an acyclic alkoxy silane monomer were used. The amounts of the monomers, HCl and water used to prepare the polymer are shown in Table 1 below. The amounts of the polymer, and the contents of Si—OH, Si—OCH$_3$ and Si—CH$_3$ in the polymer are shown in Table 1 below.

TABLE 1

| Polymer | Monomers (mmol) | | HCl (mmol) | H$_2$O (mmol) | Amount of polymer (g) | Si—OH (%) | Si—OCH$_3$ (%) | Si—CH$_3$ (%) |
| --- | --- | --- | --- | --- | --- | --- | --- | --- |
| | T4Q4 | MTMS | | | | | | |
| (a-3) | 10.00 | 23.33 | 8.11 | 405.4 | 6.1 | 32.80 | 0.70 | 66.50 |

EXAMPLE 1

0.207 g of the polymer (a-3) as a siloxane-based polymer, and 0.046 g of the polyhedral molecular silsesquioxane (n=14) prepared in Preparative Example 1 as a porogen were dissolved in propylene glycol methyl ether acetate as the solvent to prepare a coating solution (solid content: 24 wt %). The coating solution was spin-coated on a silicon wafer at 2,000 rpm for 30 seconds, and pre-baked on a hot plate under nitrogen atmosphere at 150° C. for 1 minute and at 250° C. for 1 minute, sequentially. The pre-baked silicon wafer was dried to form a film. While heating to 420° C. for 1 hour at a rate of 3° C./minute, the film was baked under nitrogen atmosphere to form a dielectric film (C-1). The thickness, refractive index, dielectric constant, hardness, modulus and carbon content of the dielectric film were measured. The results are shown in Table 2 below.

COMPARATIVE EXAMPLE 1

A dielectric film (C-2) was formed in the same manner as in Example 1, except that 0.459 g of the polymer (a-3) as a siloxane-based polymer was dissolved in propylene glycol methyl ether acetate as the solvent, without the use of the porogen, to prepare a coating solution (solid content: 24 wt %). The thickness, refractive index, dielectric constant, hardness, modulus and carbon content of the dielectric film were measured. The results are shown in Table 2 below.

COMPARATIVE EXAMPLE 2

A dielectric film (C-3) was formed in the same manner as in Example 1, except that 0.413 g of the polymer (a-3) as a siloxane-based polymer and 0.046 g of heptakis(2,3,6-tri-O-methyl)-β-cyclodextrin as a porogen were used. The thickness, refractive index, dielectric constant, hardness, modulus and carbon content of the dielectric film were measured. The results are shown in Table 2 below.

TABLE 2

| | Dielectric film | Refractive index | Thickness (nm) | Dielectric index | Hardness (GPa) | Modulus (GPa) |
|---|---|---|---|---|---|---|
| Example 1 | C-1 | 1.3792 | 4791 | 2.68 | 1.83 | 10.67 |
| Comparative Example 1 | C-2 | 1.3821 | 5655 | 2.80 | 1.93 | 11.20 |
| Comparative Example 2 | C-3 | 1.3415 | 5484 | 2.51 | 1.37 | 7.83 |

As apparent from the above description, the polyhedral molecular silsesquioxane of the present invention has a high compatibility with siloxane-based resins, and allows the introduction of a variety of reactive groups thereinto. Accordingly, a polymer prepared using the polyhedral molecular silsesquioxane is highly compatible with other porogens. In addition, a dielectric film formed using the polymer shows superior mechanical properties, thermal stability, crack resistance and insulating properties, and has a low carbon content and a high $SiO_2$ content. Therefore, the dielectric film is advantageously applicable to semiconductor devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A siloxane-based resin prepared by polycondensing At least one polyhedral molecular silsesquioxane represented by Formula 2 below:

$$[SiO_{1.5}]_n\text{—}(R)_n \quad (2)$$

wherein the substituents R may be the same or different from one another, and are each independently a hydrogen atom, a halogen atom, a hydroxyl group, or a $C_{1\sim20}$ alkyl, alkenyl, alkynyl, aryl or alkoxy group, or —$OSir_1r_2r_3$ (in which $r_1$, $r_2$ and $r_3$ are each independently a hydrogen atom, a halogen atom, or a $C_{1\sim20}$ alkyl, alkenyl, alkynyl, aryl or alkoxy group), at least one of the substituents R being a hydrolysable functional group; and n is 10, 12, 14, or 16, alone, or a mixture of the polyhedral molecular silsesquioxane and at least one silane-based monomer selected from the group consisting of compounds represented by Formulae 3 to 5 below:

wherein $R_1$ is a hydrogen atom, a $C_{1\sim3}$ alkyl group, or a $C_{6\sim15}$ aryl group; $R_2$ is a hydrogen atom, a $C_{1\sim10}$ alkyl group, or $SiX_1X_2X_3$ (in which $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group); and p is an integer between 3 and 8;

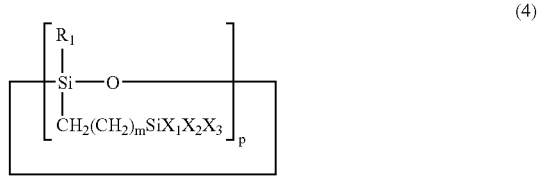

wherein $R_1$ is a hydrogen atom, a $C_{1\sim3}$ alkyl group, or a $C_{6\sim15}$ aryl group; $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; m is an integer of 0 to 10; and p is an integer of 3 to 8; and $$X_3X_2X_1Si\text{-}M\text{-}SiX_1X_2X_3 \quad (5)$$

wherein $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; and M is a single bond, a $C_{1\sim10}$ alkylene group, or a $C_{6\sim15}$ arylene group, in an organic solvent in the presence of water and an acid or base catalyst.

2. The siloxane-based resin according to claim 1, wherein the acid catalyst is hydrochloric acid, nitric acid, benzene sulfonic acid, oxalic acid, formic acid, or a mixture thereof; and the base catalyst is potassium hydroxide, sodium hydroxide, triethylamine, sodium bicarbonate, pyridine, or a mixture thereof.

3. The siloxane-based resin according to claim 1, wherein the molar ratio of the acid or base catalyst to the monomers is in the range of from $1:1\times10^{-5}$ to 1:10.

4. The siloxane-based resin according to claim 1, wherein the molar ratio of the water to the monomers is in the range of 1:1 to 1:100.

5. The siloxane-based resin according to claim 1, wherein the polymerization is carried out at 0° C.~200° C. for 0.1~100 hours.

6. The siloxane-based resin according to claim 1, wherein the organic solvent is an aliphatic hydrocarbon solvent selected from hexane and heptane, an aromatic hydrocarbon solvent selected from anisole, mesitylene and xylene, a ketone-based solvent selected from methyl isobutyl ketone, 1-methyl-2-pyrrolidinone, cyclohexanone and acetone, an ether-based solvent selected from tetrahydrofuran and isopropyl ether, an acetate-based solvent selected from ethyl acetate, butyl acetate and propylene glycol methyl ether acetate, an alcohol-based solvent selected from isopropyl alcohol and butyl alcohol, an amide-based solvent selected from dimethylacetamide and dimethylformamide, a silicon-based solvent, or a mixture thereof.

7. The siloxane-based resin according to claim 1, wherein the siloxane-based resin has a weight-average molecular weight of 1,000 to 300,000.

8. A composition for forming a dielectric film, comprising the siloxane-based resin according to claim 1, and an organic solvent.

9. The composition according to claim 8, wherein the organic solvent is an aliphatic hydrocarbon solvent selected from hexane and heptane, an aromatic hydrocarbon solvent selected from anisole, mesitylene and xylene, a ketone-based solvent selected from methyl isobutyl ketone, 1-methyl-2-pyrrolidinone, cyclohexanone and acetone, an ether-based solvent selected from tetrahydrofuran and isopropyl ether, an acetate-based solvent selected from ethyl acetate, butyl acetate and propylene glycol methyl ether acetate, an alcohol-based solvent selected from isopropyl alcohol and butyl alcohol, an amide-based solvent selected from dimethylacetamide and dimethylformamide, a silicon-based solvent, or a mixture thereof.

10. The composition according to claim 8, further comprising a porogen selected from the group consisting of cyclodextrins, polycaprolactones, alcohol alkoxylate surfactants, polyethylene glycol-polypropylene glycol-polyethylene glycol triblock copolymer surfactants, and derivatives thereof.

11. A composition for forming a dielectric film, comprising:

at least one polyhedral molecular silsesquioxane represented by Formula 2 below:

$$[SiO_{1.5}]_n\text{---}(R)_n \qquad (2)$$

wherein the substituents R may be the same or different from one another, and are each independently a hydrogen atom, a halogen atom, a hydroxyl group, or a $C_{1\sim20}$ alkyl, alkenyl, alkynyl, aryl or alkoxy group, or —$OSir_1r_2r_3$ (in which $r_1$, $r_2$ and $r_3$ are each independently a hydrogen atom, a halogen atom, or a $C_{1\sim20}$ alkyl, alkenyl, alkynyl, aryl or alkoxy group), at least one of the substituents R being a hydrolysable functional group; and n is 10, 12, 14, or 16;

a thermostable siloxane precursor; and a solvent dissolving the two components, wherein the thermostable siloxane precursor is a polycondensation product of at least one silane-based monomer selected from the group consisting of compounds represented by Formulae 3 to 5 below:

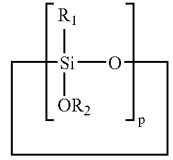

wherein $R_1$ is a hydrogen atom, a $C_{1\sim3}$ alkyl group, or a $C_{6\sim15}$ aryl group; $R_2$ is a hydrogen atom, a $C_{1\sim10}$ alkyl group, or $SiX_1X_2X_3$ (in which $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group); and p is an integer between 3 and 8;

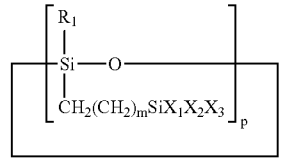

wherein $R_1$ is a hydrogen atom, a $C_{1\sim3}$ alkyl group, or a $C_{6\sim15}$ aryl group; $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; m is an integer of 0 to 10; and p is an integer of 3 to 8; and $$X_3X_2X_1Si\text{-M-}SiX_1X_2X_3 \qquad (5)$$

wherein $X_1$, $X_2$ and $X_3$ are each independently a hydrogen atom, a $C_{1\sim3}$ alkyl group, a $C_{1\sim10}$ alkoxy group, or a halogen atom, at least one of these substituents being a hydrolysable functional group; and M is a single bond, a $C_{1\sim10}$ alkylene group, or a $C_{6\sim15}$ arylene group, in an organic solvent in the presence of water and an acid or base catalyst.

12. The composition according to claim 11, further comprising a porogen selected from the group consisting of cyclodextrins, polycaprolactones, alcohol alkoxylate surfactants, polyethylene glycol-polypropylene glycol-polyethylene glycol triblock copolymer surfactants, and derivatives thereof.

13. The composition according to claim 11, wherein the polyhedral molecular silsesquioxane is used in an amount of 0.1~99.9% by weight, based on the total weight of the solid matter in the composition.

14. The composition according to claim 11, wherein the organic solvent is an aliphatic hydrocarbon solvent selected from hexane and heptane, an aromatic hydrocarbon solvent selected from anisole, mesitylene and xylene, a ketone-based solvent selected from methyl isobutyl ketone, 1-methyl-2-pyrrolidinone, cyclohexanone and acetone, an ether-based solvent selected from tetrahydrofuran and isopropyl ether, an acetate-based solvent selected from ethyl acetate, butyl acetate and propylene glycol methyl ether acetate, an alcohol-based solvent selected from isopropyl alcohol and butyl alcohol, an amide-based solvent selected from dimethylacetamide and dimethylformamide, a silicon-based solvent, or a mixture thereof.

15. The composition according to claim 11, wherein the solid content in the composition is in the range of 5~70% by weight, based on the total weight of the composition.

16. A method for forming a dielectric film, comprising the steps of preparing the composition according to claim 8, coating the composition on a substrate, and heat-curing the coated substrate.

17. The method according to claim 16, wherein the composition comprises a porogen selected from the group consisting of cyclodextrins, polycaprolactones, Brij surfactants, polyethylene glycol-polypropylene glycol-polyethylene glycol triblock copolymer surfactants, and derivatives thereof.

18. The method according to claim 16, wherein the coating is carried out by a spin coating, dip coating, spray coating, flow coating, or screen printing technique.

19. The method according to claim 16, wherein the heat-curing is carried out at a temperature of 150~600° C. for 1~180 minutes.

20. An interlayer dielectric film for a semiconductor device formed by the method according to claim 16.

21. A method for forming a dielectric film, comprising the steps of preparing the composition according to claim 11, coating the composition on a substrate, and heat-curing the coated substrate.

22. The method according to claim 21, wherein the composition comprises a porogen selected from the group consisting of cyclodextrins, polycaprolactones, Brij surfactants, polyethylene glycol-polypropylene glycol-polyethylene glycol triblock copolymer surfactants, and derivatives thereof.

23. The method according to claim 21, wherein the coating is carried out by a spin coating, dip coating, spray coating, flow coating, or screen printing technique.

24. The method according to claim 21, wherein the heat-curing is carried out at a temperature of 150~600° C. for 1~180 minutes.

25. An interlayer dielectric film for a semiconductor device formed by the method according to claim 21.

* * * * *